United States Patent [19]

Longwell et al.

[11] Patent Number: 5,598,422
[45] Date of Patent: Jan. 28, 1997

[54] DIGITAL COMPUTER HAVING AN ERROR CORRECTION CODE (ECC) SYSTEM WITH COMPARATOR INTEGRATED INTO RE-ENCODER

[75] Inventors: Michael L. Longwell; Paul F. Groepler, both of Austin, Tex.

[73] Assignee: Dell USA, L.P., Austin, Tex.

[21] Appl. No.: 531,572

[22] Filed: Sep. 7, 1995

Related U.S. Application Data

[63] Continuation of Ser. No. 273,512, Jul. 11, 1994, abandoned, which is a continuation of Ser. No. 13,128, Feb. 3, 1993, abandoned, which is a continuation of Ser. No. 516,628, Apr. 30, 1990, abandoned.

[51] Int. Cl.[6] ................................. H03M 13/00
[52] U.S. Cl. .................. 371/37.1; 371/38.1; 371/40.1
[58] Field of Search ................. 371/37.1, 38.1, 371/40.1, 40.3; 395/185.07

[56] References Cited

U.S. PATENT DOCUMENTS

| | | | |
|---|---|---|---|
| 4,100,403 | 7/1978 | Eggenberger et al. | 235/312 |
| 4,201,337 | 5/1980 | Lewis et al. | 371/37.1 |
| 4,241,446 | 12/1980 | Trubisky | 371/37.1 |
| 4,276,646 | 6/1981 | Haggard et al. | 371/37.1 |
| 4,345,328 | 8/1982 | White | 371/38.1 |
| 4,404,673 | 9/1983 | Yamanouchi | 371/38.1 |
| 4,805,173 | 2/1989 | Hillis et al. | 371/38.1 |
| 4,849,975 | 7/1989 | Patel | 371/38.1 |
| 4,939,733 | 7/1990 | Furutani | 371/40.1 |

*Primary Examiner*—Robert W. Beausoliel, Jr.
*Assistant Examiner*—Ly V. Hua
*Attorney, Agent, or Firm*—Henry N. Garrana; Mark P. Kahler; Michelle M. Turner

[57] ABSTRACT

A digital computer system has an error correction code (ECC) syndrome encoder for generating initial ECC syndromes from digital words input to the system which are received together with their corresponding ECC syndromes, in the system receiving circuitry. The system has an ECC syndrome re-encoder for generating second ECC syndromes from the digital words as they are removed from the receiving circuitry. A comparison circuit then compares the originally encoded syndrome with the re-encoded syndrome as it is being generated, to detect whether there is a difference and therefore an error in the digital word or an error in the syndrome. The comparison circuit is integrated into and is a part of the ECC re-encoder.

4 Claims, 13 Drawing Sheets

DIGITAL COMPUTER HAVING AN ERROR CORRECTION CODE (ECC) SYSTEM WITH COMPARATOR INTEGRATED INTO RE-ENCODER

CROSS REFERENCE TO RELATED APPLICATIONS

This application is a continuation of application Ser. No. 08/273,512, filed Jul. 11, 1994, now abandoned which is a continuation, of application Ser. No. 08/013,128 filed Feb. 3, 1993, abandoned, which was a File Wrapper Continuation of Ser. No. 07/516,628 filed Apr.30, 1990, now abandoned.

This application is related to the following U.S. patent application:

| SERIAL NO. | TITLE | INVENTOR |
| --- | --- | --- |
| 07/490,003 | METHOD AND APPARATUS FOR PERFORMING MULTI-MASTER BUS PIPELINING | Zeller, et al. |

The above listed applications are all assigned to the assignee of this invention and are incorporated herein by reference.

BACKGROUND OF THE INVENTION

1. Field of the Invention

This invention relates to a digital computer system having an error correction code (ECC) system for generating ECC syndromes on digital words to be stored or transmitted. An ECC re-encoder for generating syndromes on the digital words as they are removed from storage or after transmission is included, as well as a comparator for comparing the pre-storage/pre-transmission syndromes with the post-storage/post-transmission syndromes. More particularly, it pertains to an ECC system in which the comparator is included in and is a part of the re-encoder.

2. Description of the Related Art

In data processing systems it has been necessary to have circuitry which checks data that has been transmitted between system units or which has been stored in system memories and detects errors which may have been introduced during the transmission or storage operations. Error detection and correction is especially necessary in systems in which data transmissions or storage is performed at high speeds because such systems are more prone to disturbances by noise and other erroneous signals.

Many prior art systems have been developed to protect data stored in memories and data which is transmitted between data processing circuits. Simple parity checking was done in the past to effectively count the number of ones in a digital word, and if odd, assign a one parity bit and if even, assign a zero parity bit (odd parity). Typically, a parity generator adds the parity check bit to each word before transmission. In such a manner, odd sets automatically become even with the extra one and even sets remain unchanged by the extra zero.

In such parity checking systems, an error in a single digit or bit in a data word is discernable since the parity check bit associated with that data word containing an error is the reverse from what is expected. To confirm that the bits have not changed after each transmission or storage, thereby indicating that no error has occurred, the number of ones in each word are recounted and, if the result is an odd number for an even parity system or if the result is an even number for an odd parity system, the result indicates that one of the bits in the data word is in error.

After detection of an error, such systems are often configured to retrieve or recreate the original data word, for example by requesting a repeat transmission of the original data word before continuing processing, thereby correcting the error. Others of such systems are configured to simply output a signal indicating to the user that an error has occurred. One drawback to such systems is that only errors in an odd number of digits can be detected with a single parity check, since an even number of errors results in the parity expected for a correct transmission. Furthermore, the specific bit in error cannot be identified by the parity check procedure described herein. To correct a single incorrect bit, the entire data word, including both correct and incorrect bits, must be reproduced. Thus, parity checking words works most effectively when the errors are few and far between. Finally, parity checking is not adequate as a defense against data errors when there is a permanent defect in the memory cell or other storage element that makes retransmission ineffective as a remedy. Such situations call for more elaborate coding strategies capable of correcting the problem as well as detecting it.

It has been widely recognized that error detection and/or correction is desirable in situations where an input digital word is operated upon in a manner having a significant probability of inadvertent alteration of at least one of the bits. Accordingly, it is common in modern digital computer systems to incorporate an error detection and/or correction scheme selected to provide a desired level of reliability at an acceptable cost. For example, simple parity check techniques as described above are generally satisfactory when the number of words is limited. Block error correction techniques have found use in systems which involve very large numbers of words and hence a higher probability of error.

A block error correction code is described in detail in the Bell System Technical Journal Volume XXIX, April 1950, Number 2 entitled "Error Detecting and Error Correcting Codes" by R. W. Hamming. This code has been used extensively over the years in connection with relatively short binary words. For example, a 16 bit input word requires a 6 bit Hamming Code to provide a capability of detecting two errors and correcting one within that 16 bit word. A 32 bit input word requires a 7 bit Hamming Code to provide a capability of detecting two errors and correcting one within that 32 bit word. This capability is essential in those systems that use a very large number of words (very large memory).

The Hamming Code is a system of multiple parity checks that encodes data words in a logical manner so that single errors can be not only detected but also identified for correction. A transmitted data word used in the Hamming Code consists of the original data word and parity check digits appended thereto. Each of the required parity checks is performed upon the specific bit positions of the transmitted word. The system enables the isolation of an erroneous digit, whether it is in one of the original data bits or in one of the added parity check bits. If all of the parity check operations are performed successfully, the data word is assumed to be error free. If one or more of the check operations is unsuccessful, however, a single bit error is uniquely determined by decoding so-called syndrome bits which are derived from the parity check bit.

In the prior art, incoming digital words have had ECC syndromes generated and stored in the memory along with the associated digital word. The word and syndrome are both read from memory and a new syndrome is generated from the word read from memory. After having generated this new syndrome, it is compared with the original syndrome stored in the memory. The syndrome generation and comparison is done in two separate and distinct steps.

According to the present invention, the comparison between the two syndromes begins at the first and second levels of the generation of the new syndrome.

BRIEF SUMMARY OF THE INVENTION

A digital computer system has an error correction code (ECC) syndrome encoder for generating initial ECC syndromes from digital words input to the system, to be stored or transmitted. The system further includes an ECC re-encoder for generating syndromes from the digital words as they are read from storage or from a transmission line. Also included is a comparator for comparing the syndromes generated from the digital words before they are stored or transmitted with the syndromes generated from the words after they are read from storage or a transmission line. A comparator compares the two syndromes on a bitwise basis to determine whether there is a discrepancy. If a discrepancy exists, then there is an error or there are errors in the digital words after being stored or transmitted, or in the syndromes generated on the digital words before and after being stored or transmitted. This invention involves the combination of circuitry to provide the ECC syndrome as well as the comparison. The comparator is integrated into and made a part of the ECC re-encoder.

The main object of this invention is to provide a digital computer system with an ECC syndrome re-encoder that includes a comparator, integrated into and made a part of the re-encoder.

Another object of this invention is to provide a digital computer system with an ECC re-encoder—comparator combination to save time and circuitry in the re-encoding and comparison procedure.

These and other objects will be made evident in the detailed description that follows.

DETAILED DESCRIPTION OF THE INVENTION

A digital computer system has an ECC syndrome encoder for generating a syndrome from each digital word to be stored or transmitted. Also included is a re-encoder—comparator for generating a new syndrome from each digital word as it is read out of storage or after transmission and, in the same circuitry, for comparing the original syndrome with the new syndrome to detect any error therebetween.

Figure 1:
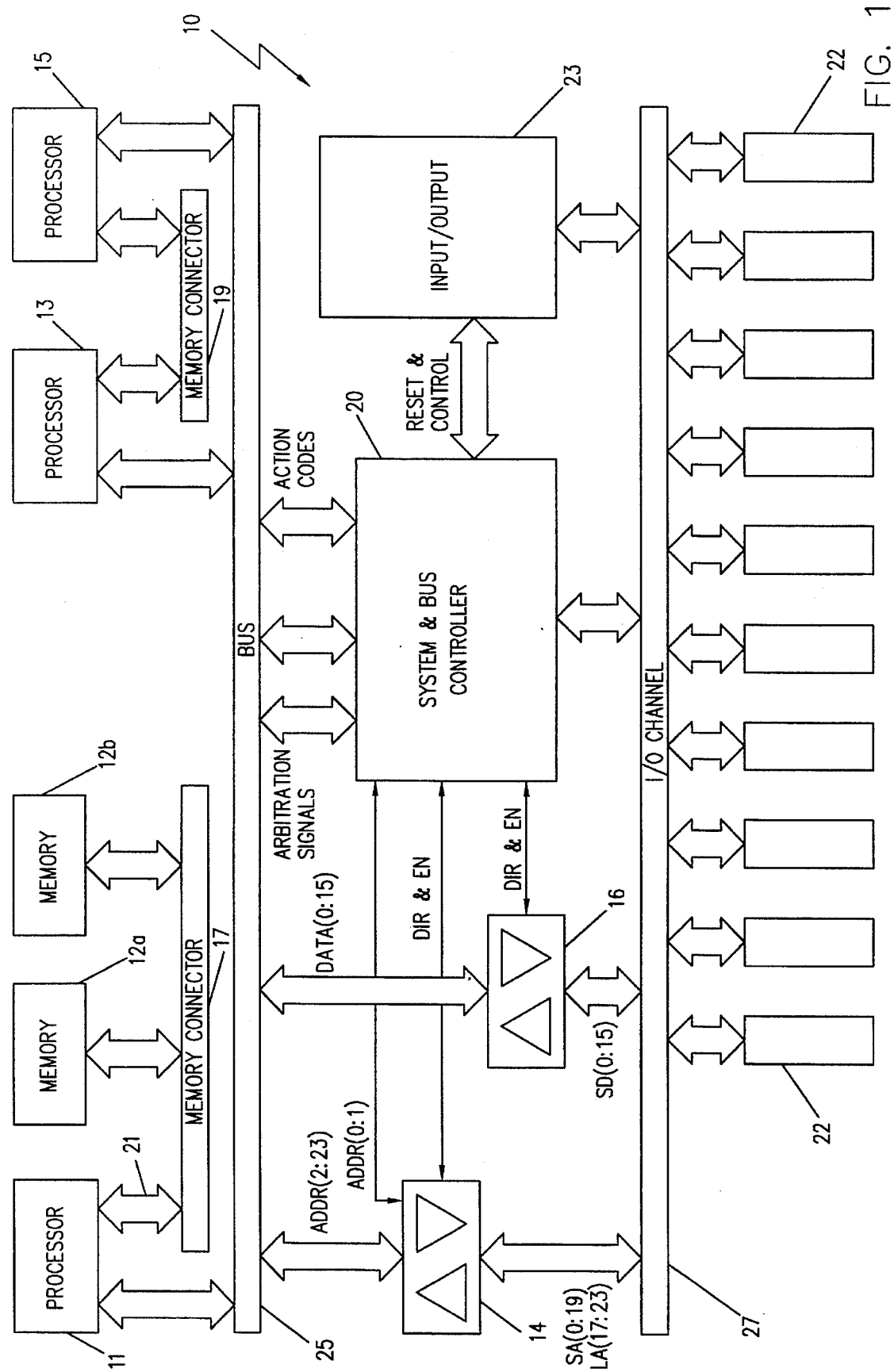
FIG. 1 is a block diagram of the digital computer system of the present invention.
Figure 2:
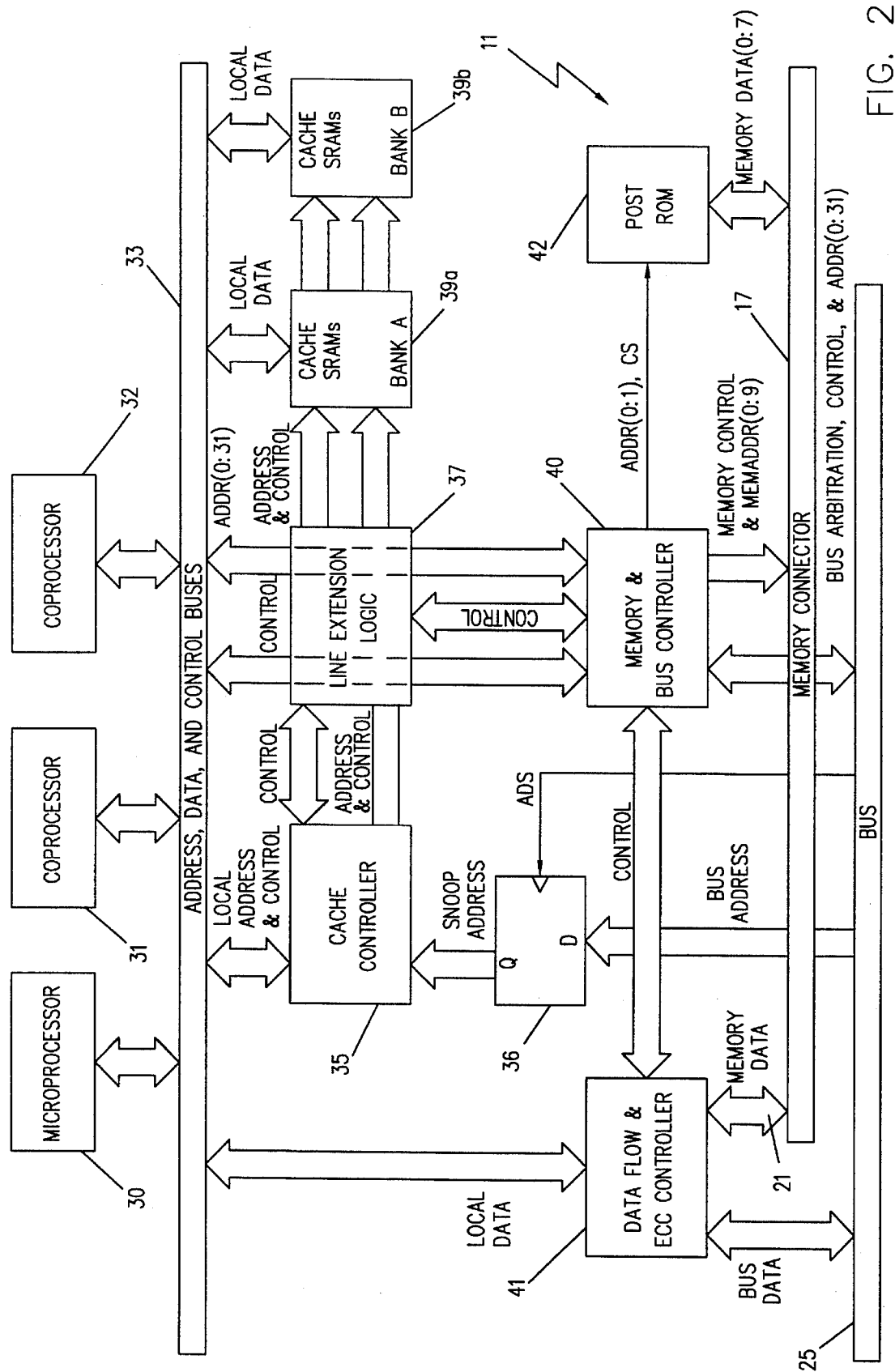
FIG. 2 is a block diagram of a single master processor included in the computer system of FIG. 1.

Referring first to FIG. 1 there is illustrated a computer system 10 having separate processors 11, 13, and 15. Memories 12a and 12b are associated with processor 11 through memory connector 17. The number of processors is not relevant to this invention. In the preferred embodiment, memories 12a and 12b are dynamic random access memories (DRAMs) and either one of the processors 13 and 15 may access memories 12a or 12b through processor 11. In the present system, such memory access is made by a requesting processor 13 or 15 which becomes a master device to processor 11 and its associated memory 12a or 12b which becomes a slave device. The memory bus cycle and the I/O bus cycle are the same except for a memory or I/O cycle designation, and the address of the slave device. Processors 11, 13, and 15 are interconnected to one another through bus 25. Address and data signals are communicated to and from the I/O channel 27 by the bi-directional drivers 14 and 16, respectively. These drivers are controlled by the System and Bus Controller 20 through the DIR and EN signals, as shown. Arbitration signals, as well as action codes, are developed by an arbiter which is contained within a System and Bus Controller 20. Input/Output 23 represents the various peripheral devices which communicate with both the I/O channel 27 and the System and Bus Controller 20. System and Bus Controller 20 and Input/Output 23 are connected to I/O channel 27. The system address (SA), system data (SD), and the local address (LA) are applied from the bus 25 to the I/O channel 27 through drivers 14 and 16 and under control of gating circuitry contained within the System and Bus Controller 20. Card slots 22 connected to I/O channel 27 may be used for extra peripheral devices or additional memory in the conventional fashion. Additional memory installed in the slots 22 is accessed through a memory bus cycle to the I/O channel. Referring you to FIG. 2, Controller 41 is connected to memory and bus controller 40 which is also connected to bus 33, receiving and transmitting control and address information. Controller 41 includes the ECC syndrome and parity encoding circuitry of this invention. Memory data from controller 41 travels through memory data path 21 to memory connector 17. POST ROM 42 is Read Only Memory (ROM) used for power-on, self-test. Controller 40 and POST ROM 42 are shown connected to memory connector 17.

FIG. 2 illustrates digital computer system 11 (personal computer system in this preferred embodiment) in block form. Processor 11 is made up of microprocessor 30 and coprocessors 31 and 32. In this preferred embodiment, microprocessor 30 is an Intel Type 80386, coprocessor 31 is an Intel Type 80387, and coprocessor 32 is a floating point unit made by Weitek Company. Of course, other type microprocessors and coprocessors could be used as well. All are interconnected through address, data and control buses 33. Cache controller 35 connects to bus 33 and also through line extension logic 37 to cache SRAMs 39a and 39b. Snoop address latch 36 latches bus addresses and sends them to Cache Controller 35. Data Flow and ECC Controller 41 is connected to bus 33 and receives local data therefrom. Controller 41 is connected to memory and bus controller 40 which is also connected to bus 33, receiving and transmitting control and address information. Controller 41 includes the ECC syndrome and parity encoding circuitry of this invention. Memory data from controller 41 travels through memory data path 21 to memory connector 17. POST ROM 42 is a Read Only Memory (ROM) used for power-on, self-test. Controller 40 and POST ROM 42 are shown connected to memory connector 17.

Figure 3:
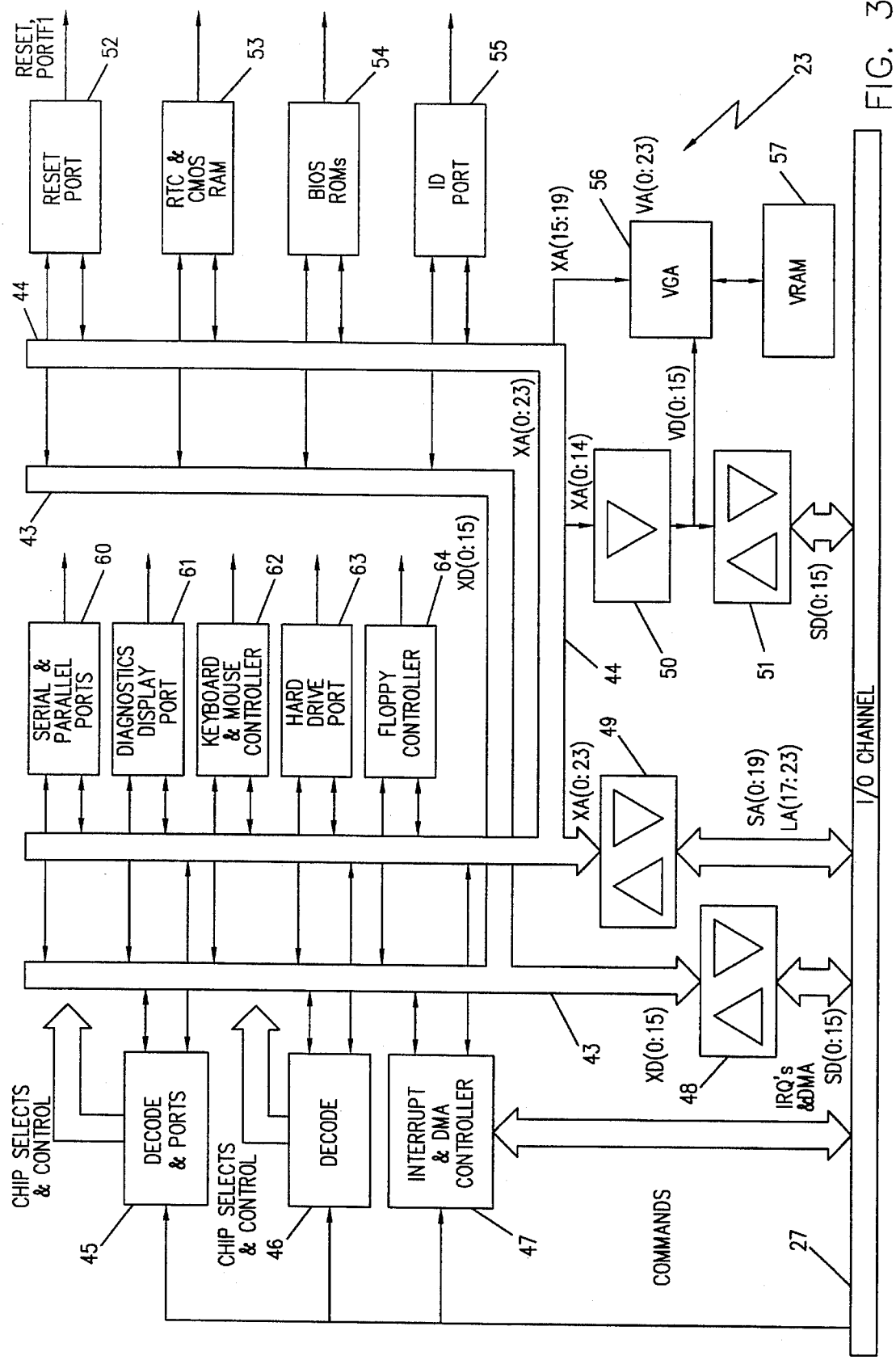
FIG. 3 is a block diagram of the Input/Output section of the computer system of FIG. 1.

FIG. 3 is a block diagram of the Input/Output 23 of the system of FIG. 1. As illustrated in FIG. 1, I/O channel 27 is the communication link between the multiple processors and the various Input/Output devices shown in FIG. 3, including decoders 45 and 46 and an Interrupt and DMA Controller 47. The Input/Output devices 52–57 and 60–64 are all controlled by way of the I/O channel 27 through bi-directional drivers 48 and 49. VGA 56 is a video graphics adapter for producing images on a system monitor under control of data stored in VRAM 57.

Figure 4:
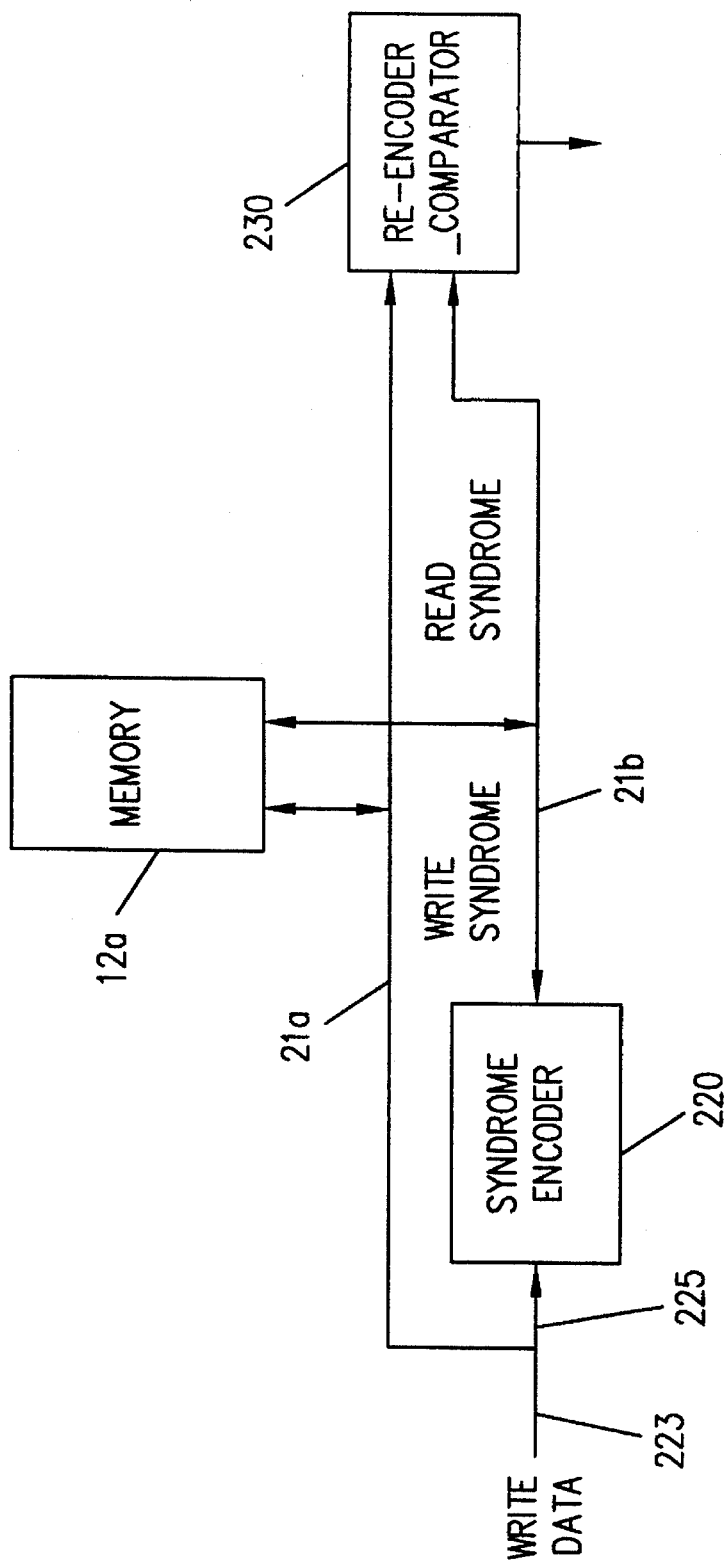
FIG. 4 is a block diagram of the ECC syndrome system of this invention.

FIG. 4 illustrates, in block form, bus 223 for transmission of a 32 bit digital word to be written into memory 12a, such word being directly transmitted over bus 21a. The digital word is also transmitted, over bus 225, to syndrome encoder 220 wherein seven syndrome bits are generated and transmitted to memory 12a over bus 21b. Syndrome encoder 220 is described in detail in copending patent application, Ser. No. 07/516,606 entitled "Shared Logic for Error Correction Syndrome Encoding", filed on even date herewith, assigned to the assignee of this invention and incorporated herein by reference.

The digital word is read out of memory 12a and sent over bus 21a to re-encoder—comparator 230. In re-encoder—comparator 230, a new ECC syndrome is generated from the digital word read from memory 12a. Also, the syndrome that was stored in memory 12a is transmitted over bus 21b to re-encoder—comparator 230 where it is compared with the new ECC syndrome. Any difference between the syndromes indicates an error in the digital word read out or in the syndrome read out from memory 12a.

The description relating to memory 12a relates as well to controllers and other storage units of FIG. 3. For example, the use of VRAM 57 involves the same generation of ECC syndromes for storage therein in the same manner that memory 12a required such syndromes.

Figure 5:
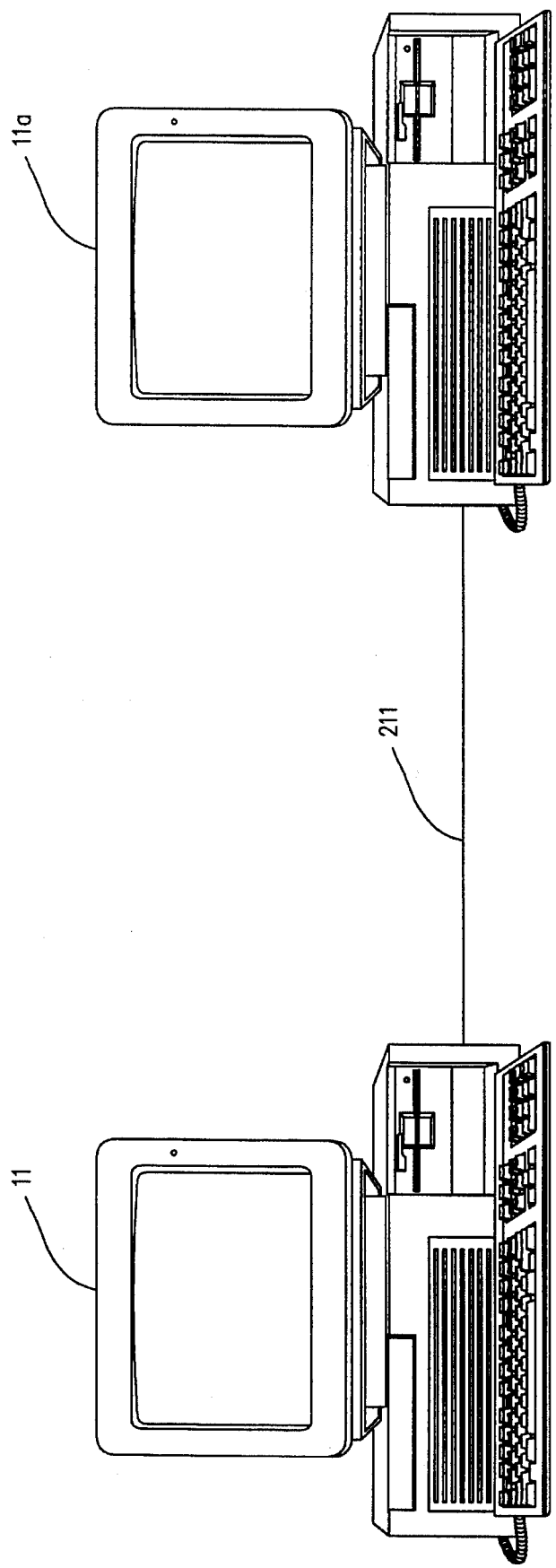
FIG. 5 illustrates two computers interconnected by a transmission line.

Referring to FIG. 1 illustrates the path that the data takes from Processor 11, for example, into bus 25 and through buffers 16 to I/O Channel 27 and then to any of the I/O devices in slots 22. The I/O devices are shown in FIG. 3. Also, in still another embodiment, shown in FIG. 5, computer system 11 is shown connected to computer system 11a system via transmission line 211. Computers 11 and 11a both include the shared logic for error correction syndrome in coding of this invention. For example, when information is sent from computer 11 to 11a over transmission line 211, the ECC syndrome is regenerated by the circuitry in computer 11a and compared with the original ECC syndrome generated, prior to transmission, by computer 11. In the manner to be described below in detail, a determination is made of whether there has been a change in the data transmitted.

The following table illustrates the algorithms used in this invention in re-encoder—comparator 230. A comparison of this table with the table shown in the above referenced U.S. patent application Ser. No. 07/516,606 for syndrome encoder 220 illustrates an exact identity. The abscissa illustrates the digital word input for encoding bits 0–31, and the ordinate illustrates the syndrome bits S0–S6. The circuitry shown in FIGS. 7A–7E uses exclusive-NOR gate logic trees to perform modulo-two addition, which implements the equations described by the table.

```
       3 3 2 2 2 2 2 2 1 1 1 1 1 1
       1 0 9 8 7 6 5 4 3 2 1 0 9 8 7 6 5 4 3 2 1 0 9 8 7 6 5 4 3 2 1 0
  S0   + +     +   + +                         + + + + + + + + + +
  S1   +   +   +                 + + + + + + + + + + + +
  S2                 + + + + + + + + + + +             +           +
  S3   + + + + + + + + + + + +           +                   +           +
  S4   + + + +           +       + +       + + +             + +
  S5     + + + +           + + +         +     + +       +     +
  S6   +           + + +       +   +     + +     + +   +       + + + +
```

'+' denotes inclusion in the modulo-two addition

Figure 6:
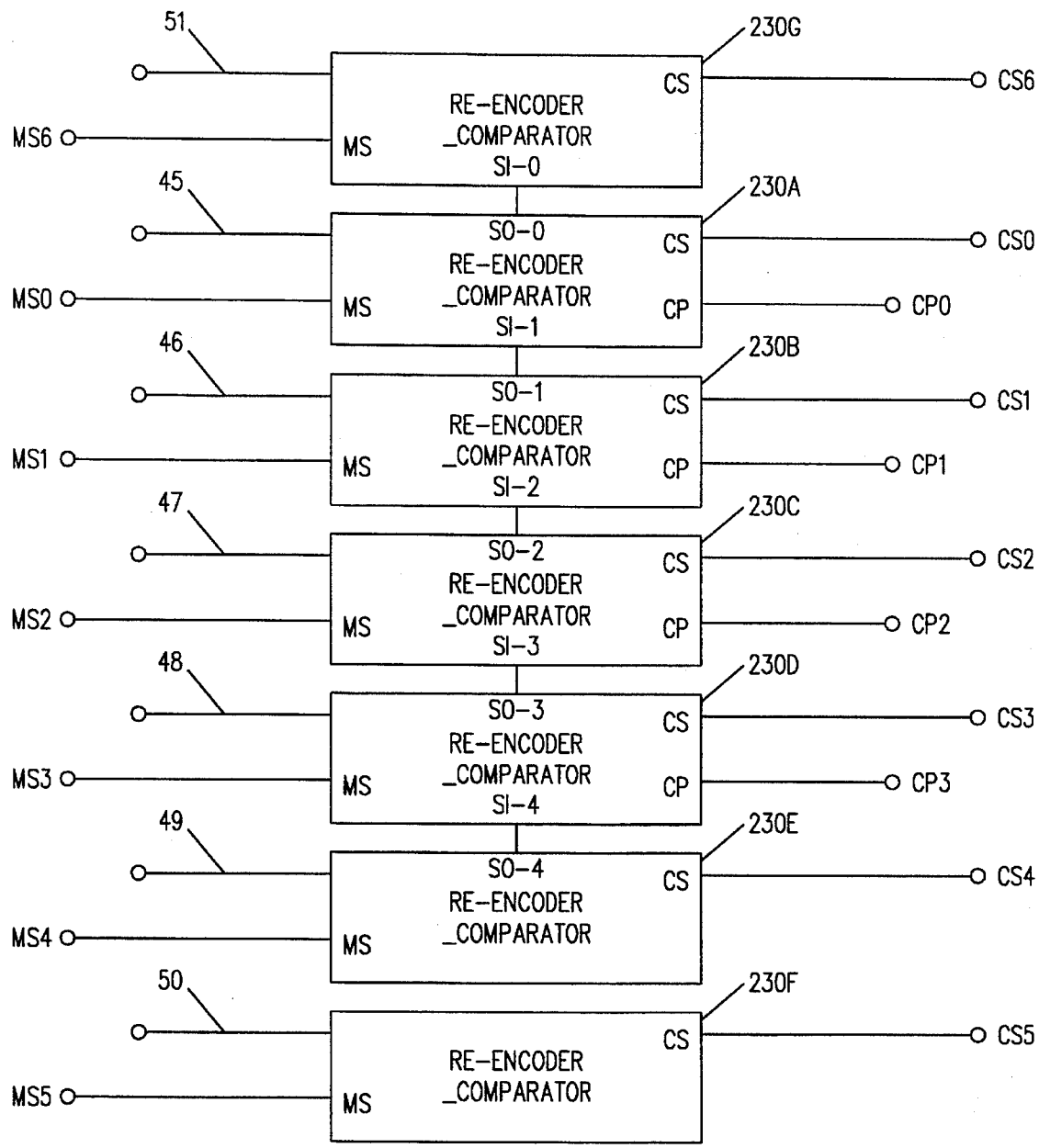
FIG. 6 is a block diagram of the re-encoder of this invention.

FIG. 6 illustrates re-encoder—comparator 230 in block form as separate re-encoder—comparators 230A–230G. The input on buses 45–51 to re-encoder—comparators 230A–230G, respectively, are bits from the digital word read from memory 12a (or transmission line 211, or I/O device of FIG. 3) that are specified for generating a particular syndrome bit. For example, bits 0–8, 17, 19, 22, 27 and 29 are the bits that are required for the generation of syndrome bit 0.

Inputs MS0–MS6 are syndrome bits read from memory (or transmission line 211, or I/O devices of FIG. 3) for the digital word read out. Within re-encoder-comparators 230A–230G, a new syndrome is generated and compared with the syndrome read from memory as signals MS0–MS6, resulting in outputs CS0–CS6. When those outputs are all true (low), then no error is indicated. Output signals CP0–CP3 represent parity bits. Parity encoding is accomplished along with the generation of the ECC syndrome. The parity encoding, re-encoding and comparing is not pertinent to the present invention.

Figure 7A:
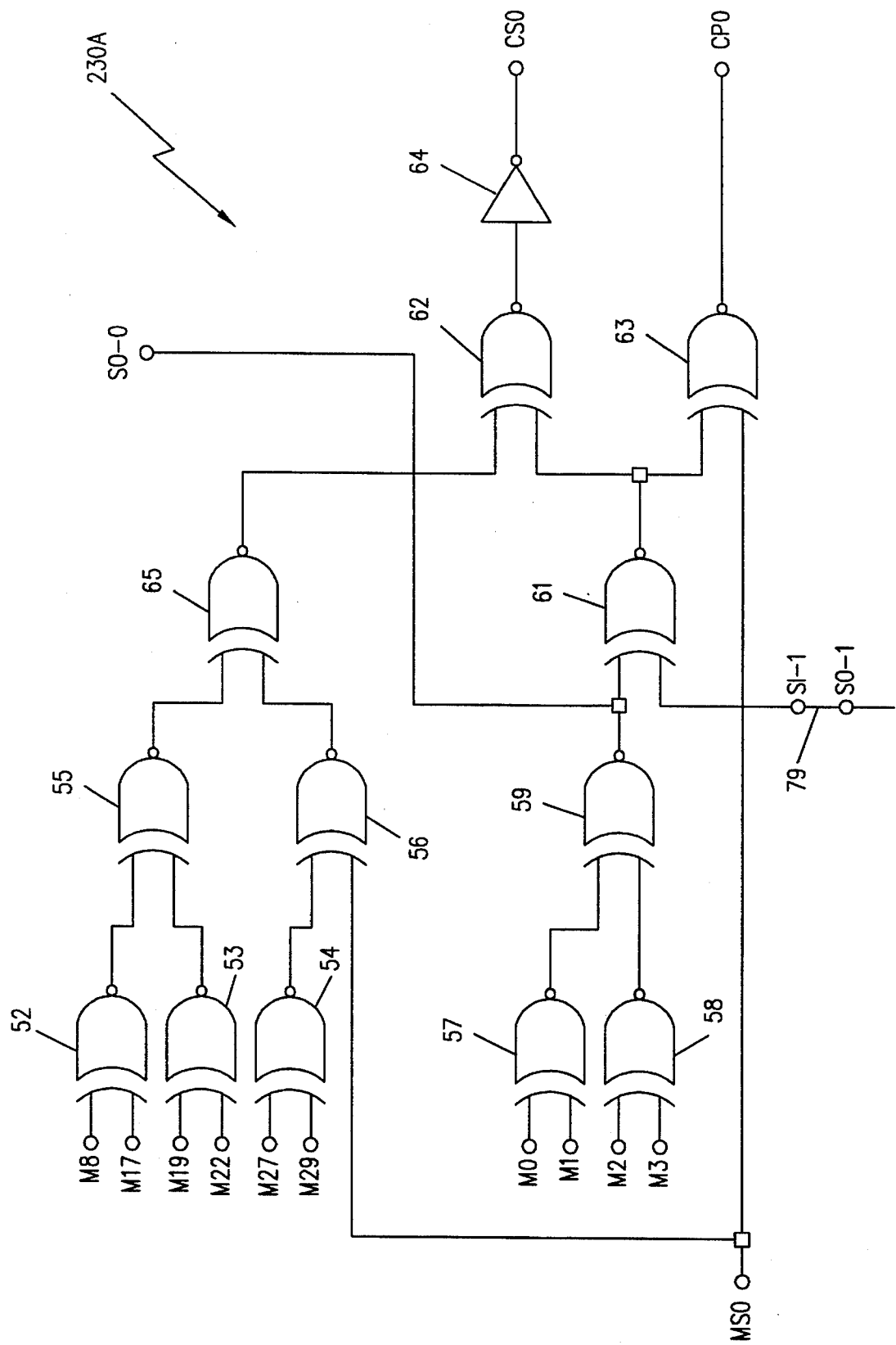
FIGS. 7A–7E are schematic diagrams forming the re-encoder—comparator of this invention.
Figure 7A:
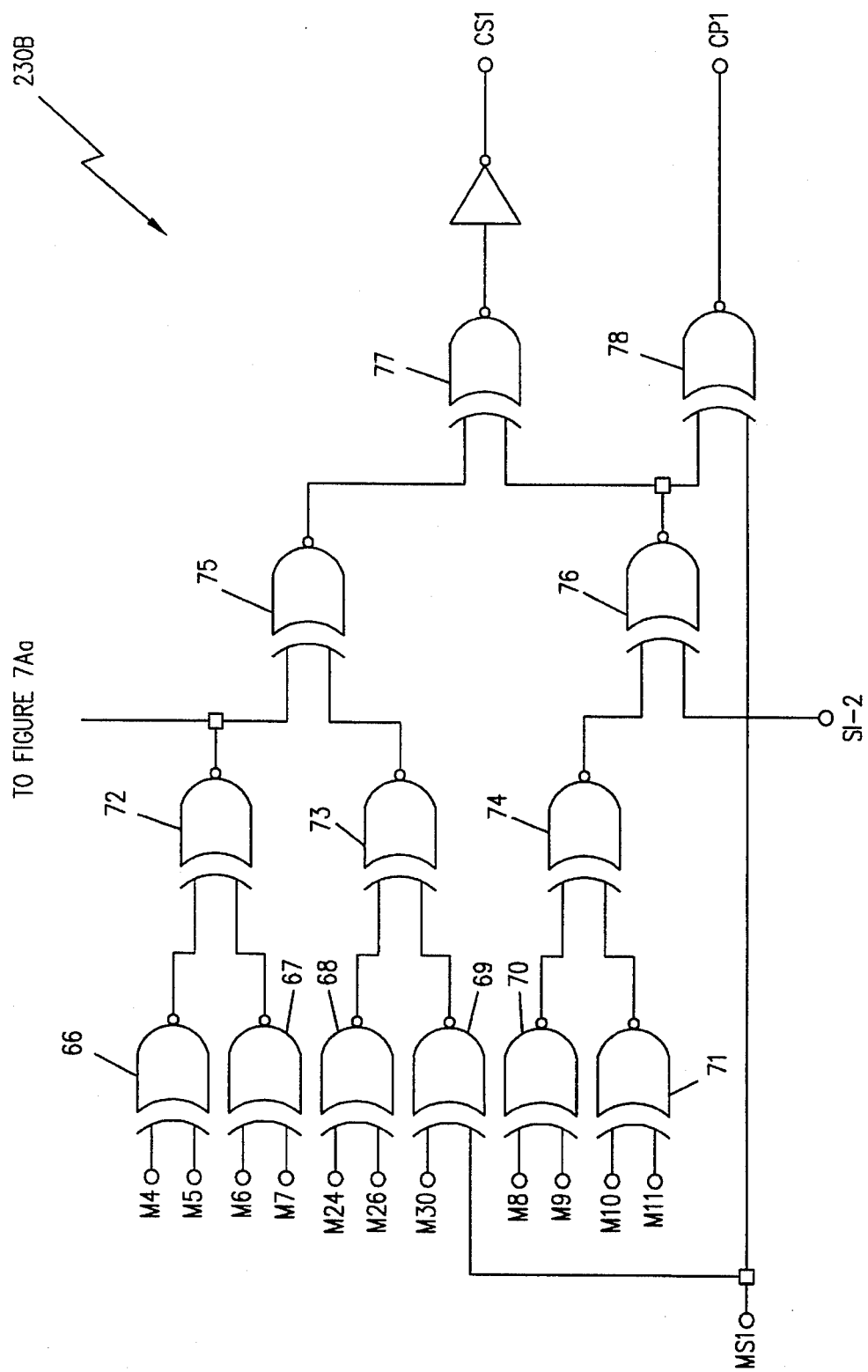

FIG. 7A schematically illustrates re-encoder-comparators 230A and 230B with line 79 shown connecting SO-1 "shared out" with point SI-1 "shared in" so that an intermediate output from exclusive-NOR gate 72 is used as an intermediate input to exclusive-NOR gate 61. The use of one syndrome generator (230B) to be shared with another syndrome generator (230A) for the generation of another syndrome (SO) and similar sharing shown in FIGS. 4B, 4C, and 4E is described in detail in U.S. patent application Ser. No. 07/516,606.

Exclusive NOR-gates 52–54, 56–58 and 66–71 receive pairs of bits from the digital word read from memory 22, as shown. Bit M8 and M17, M19 and M22, M27 and M29, M0 and M1, M2 and M3, M4 and M5, M6 and M7, M24 and M26, M8 and M9, M10 and M11 are provided.

Note that the syndrome bit MS0 from memory is applied to the input of exclusive-NOR gate 56 which receives its other input from the output of exclusive-NOR gate 54. Therefore, a comparison of the original syndrome begins with the syndrome being generated. The comparison is then generated through exclusive NOR gate 65 and exclusive NOR-gate 62 whose other input is the output of exclusive-NOR 61, with the final comparison then being made in exclusive-NOR gate 62. Exclusive-NOR gate 55 receives its inputs from the outputs of exclusive-NOR gates 52 and 53. Exclusive-NOR gate 59 receives its inputs from exclusive-NOR gates 57 and 58, as shown. If the comparison illustrates no error, then the inverted output of exclusive-NOR gate 62 is low as signal CS0.

Signal MS0 is also applied to one input of exclusive-NOR gate 63 whose other input is provided by the output from exclusive NOR-gate 61 to compare a new parity bit with that from memory (MS1). When parity is used, it is at the users option and illustrates the prior art in that the output from exclusive-NOR gate 61 is the newly generated parity bit and MS0 represents the parity bit read from memory with a subsequent comparison made in exclusive-NOR gate 63. In this invention, the comparison started in exclusive-NOR gate 56 to eliminate one level of logic which, in the prior art, would have required another exclusive-NOR gate to receive the output from exclusive-NOR gate 62 and signal MS0 for a comparison to then be made. This inclusion results in another level of logic with more time being required to re-encode and compare syndromes.

In syndrome generator 230B, signal MS1 is shown applied to the input of exclusive-NOR gate 69, along with bit M30 from the digital word read from memory. Exclusive-NOR gates 72–74 receive the outputs from exclusive-NOR gates 66 and 67, 68 and 69, and 70 and 71, respectively. Therefore, syndrome bit MS1 from memory 12a is input to exclusive-NOR gate 75 whose other input is provided by exclusive-NOR gate 72. Exclusive-NOR gate 74 receives its inputs from exclusive-NOR gates 70 and 71 and provides one input to exclusive-NOR gate 76. The other input to exclusive-NOR gate 76 is a shared input SI-2.

By introducing the syndrome bits MS0–MS6 in a non-obvious manner, early in the re-encoding algorithm for comparison, an extra level of logic is saved in each of re-encoders 30A–30G, thus reducing the time required for the re-encoding and comparison operation.

MODE OF OPERATION OF THE INVENTION

In FIG. 2, a 32 bit word comes from microprocessor 30 for storage in memory 12a of FIG. 4. As indicated above, the 32 bit word could be stored in the devices of FIG. 3, or transmitted over transmission line 211 of FIG. 5. The following description applies as well to those embodiments. A 32 bit digital word is transmitted over the local data bus to Data Flow and ECC Controller 41.

The 32 bit word, within Controller 41, is sent on write data bus 223 into syndrome encoder 220 of FIG. 4 over bus 225 and into memory 12a over bus 21a. The syndrome is generated in syndrome encoder 220 and sent over bus 21b for storage along with the digital word on 21b in memory 12a. When the digital word is read out of memory 12a it is sent into re-encoder—comparator 230 over bus 21a and the seven bit syndrome is also read out of memory 12a and sent over bus 21a to re-encoder—comparator 230. The re-encoding is accomplished in exclusive-NOR gate logic trees illustrated in FIGS. 7A–7E.

Referring specifically to FIG. 7A, syndrome bit MS0 from memory is applied as one input of exclusive-NOR gate 56, early in the re-encoding procedure. A comparison is accomplished at the output of exclusive-NOR gate 62 where it is inverted through inverter 64 and provides an output as signal CS0. In this case, the comparison is started with the second logic level of re-encoding.

In unit 230B, the comparison begins with signal MS1 being applied as an input to exclusive-NOR gate 69 at the first level of re-encoding logic, whose other input is bit M30 from the digital word read from memory. A comparison is completed through exclusive-NOR gate 77, whose inverted output is signal CS1, indicating whether or not an error is present.

Figure 7B:
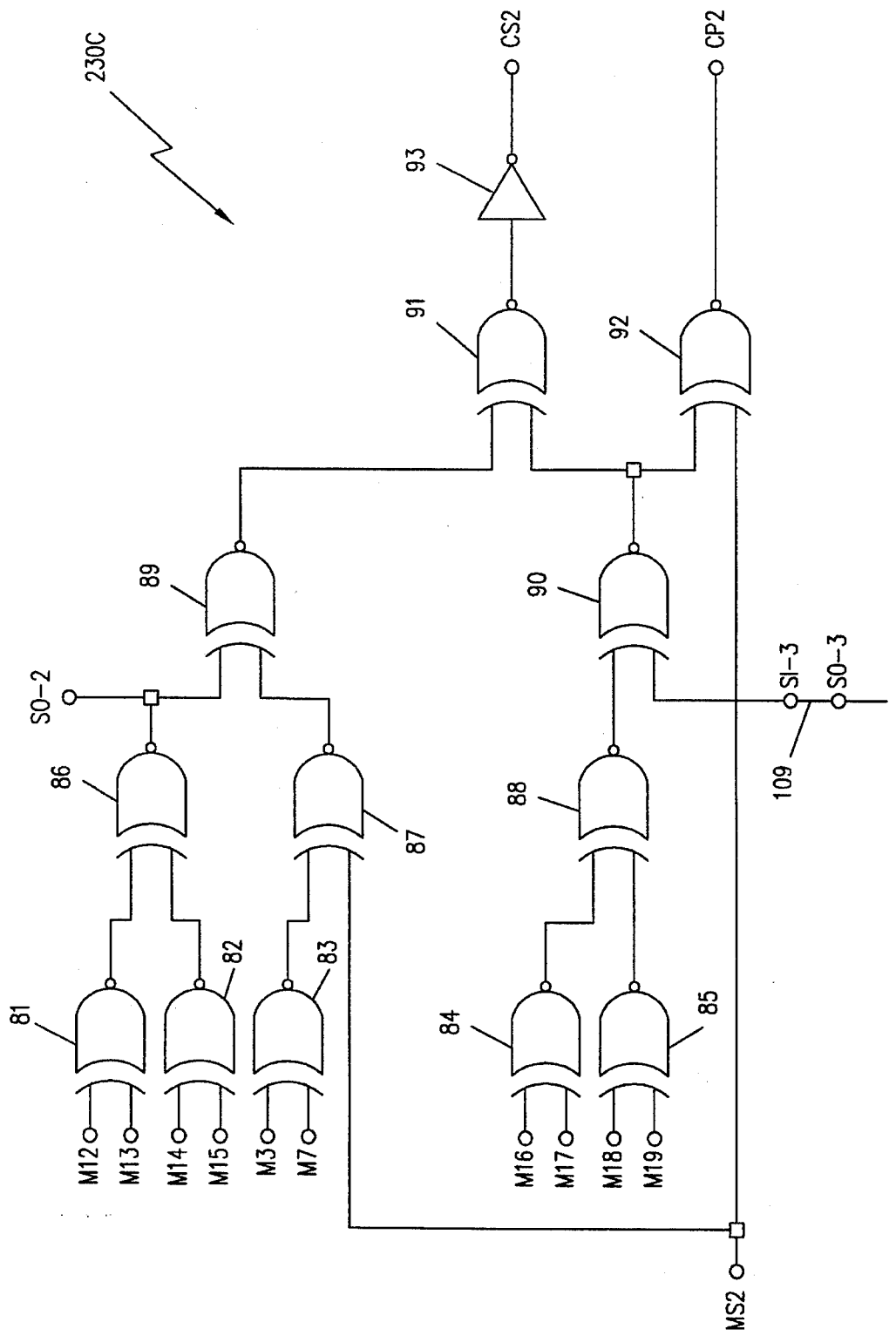
Figure 7B:
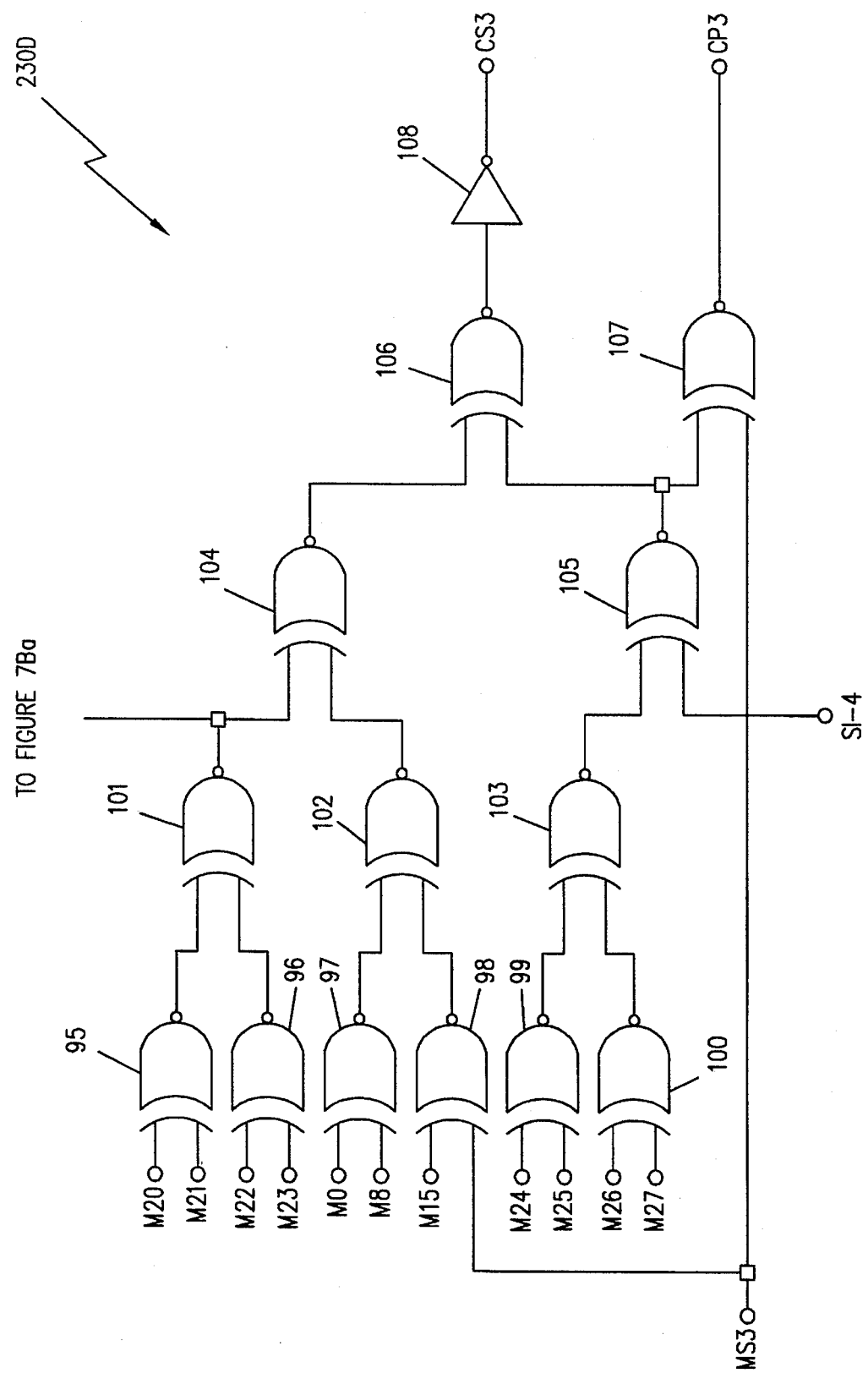

In FIG. 7B, in unit 230C, it is shown that syndrome bit 2 from memory, signal MS2, is applied as an input to exclusive-NOR gate 87, at the second level of re-encoding logic for the beginning of comparison. The comparison is completed in exclusive-NOR gate 91 whose output is inverted through inverter 93 resulting in comparison signal CS2.

In unit 230D the third syndrome bit from memory, MS3, provides one input to exclusive-NOR gate 98 whose other input is provided by the digital word read from memory, bus M15. This input is provided at the very first stage of the re-encoding by the re-encoder—comparator 230D. The final comparison is made through exclusive-NOR gate 106 whose output is inverted through inverter 108 resulting in comparison signal CS3.

Figure 7C:
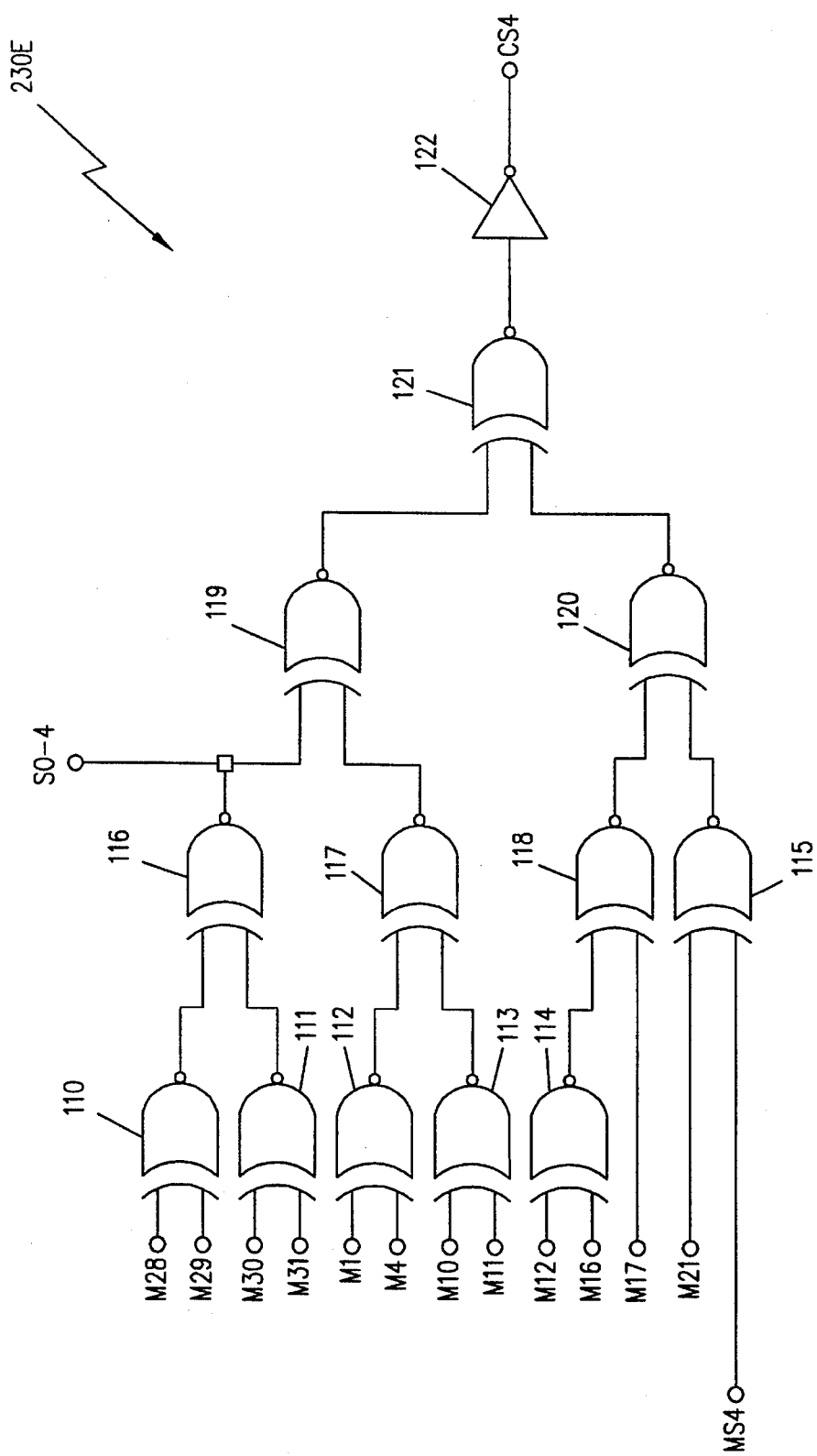
Figure 7D:
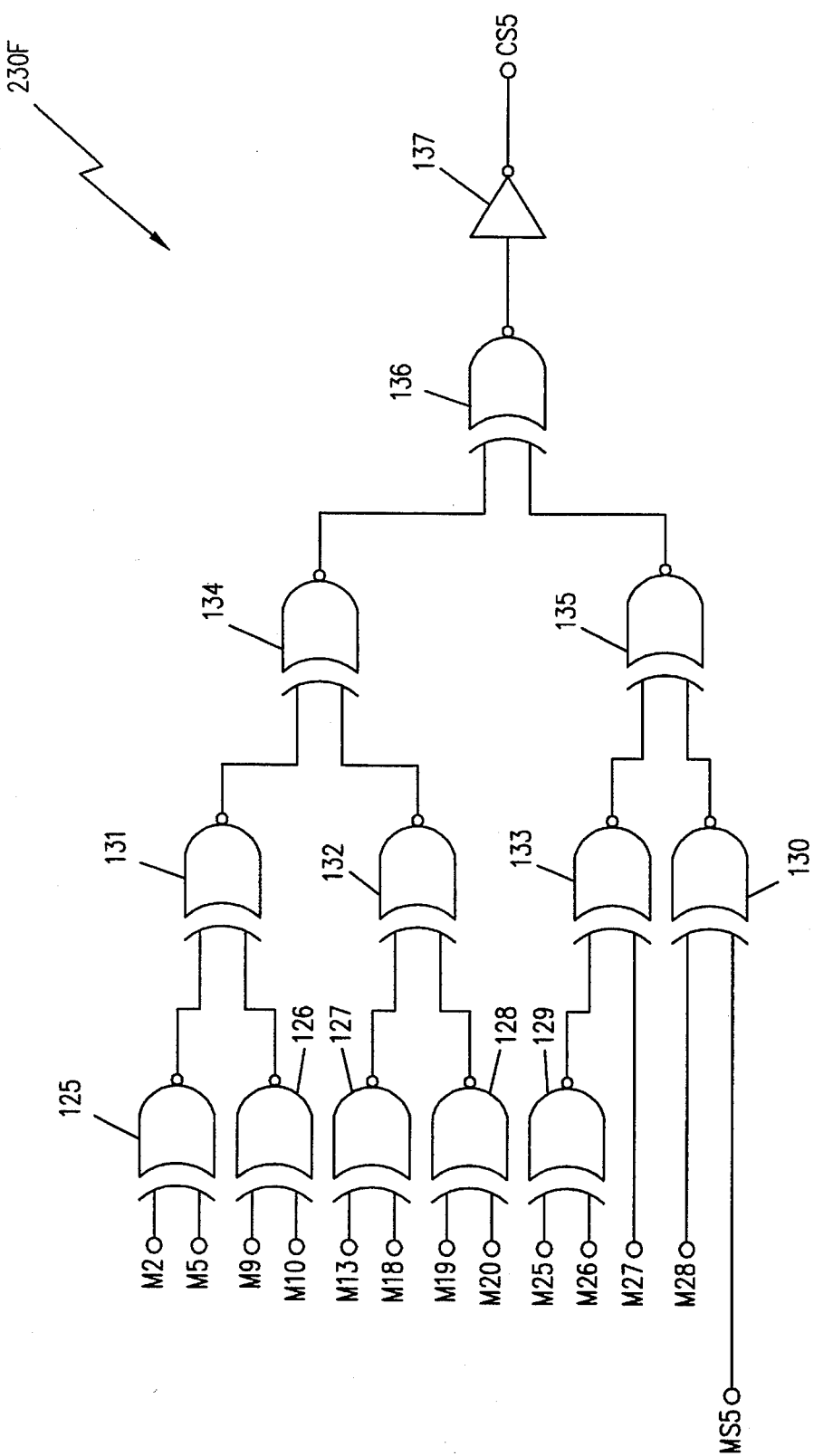
Figure 7E:
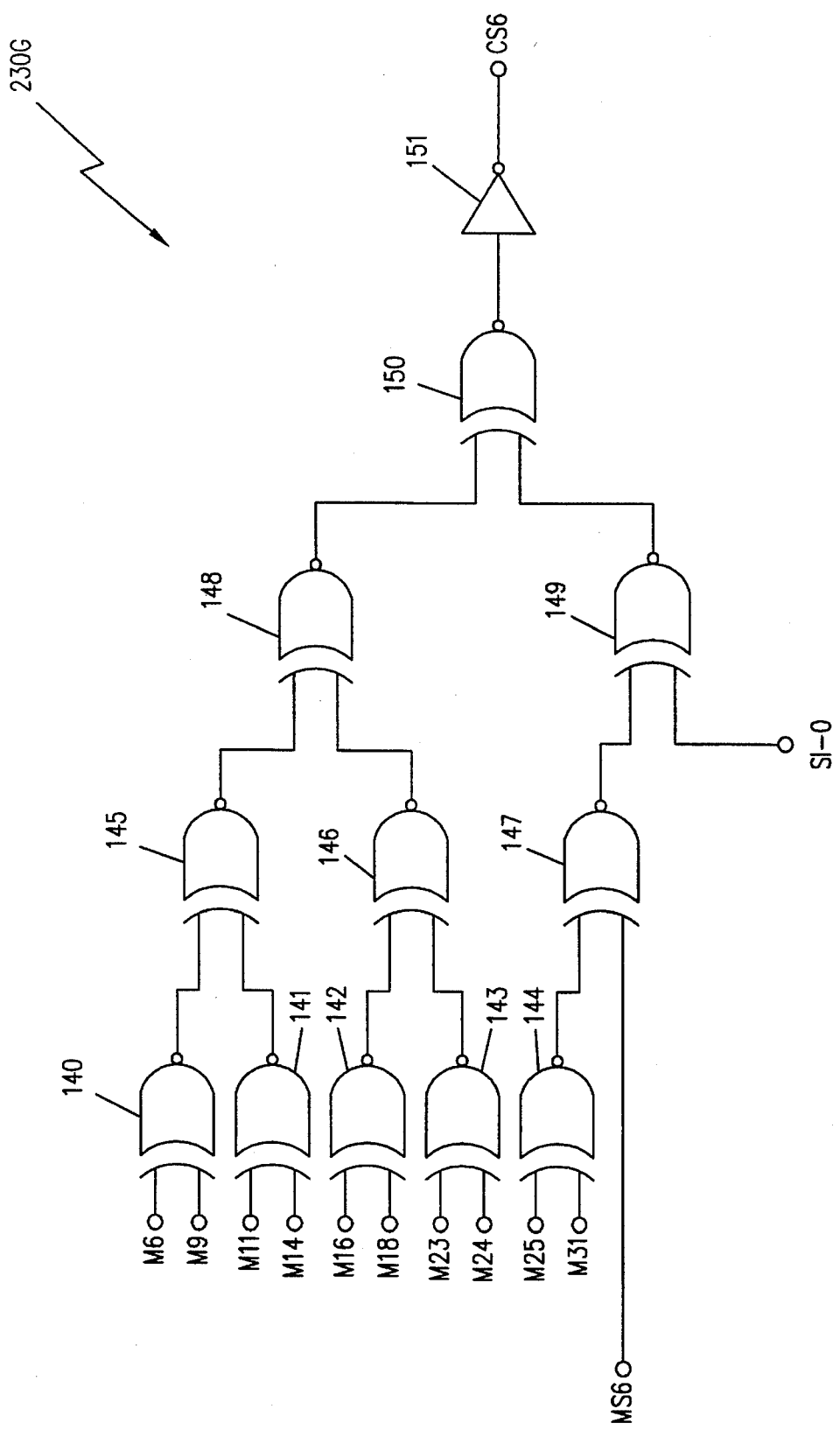

In each of units 230E, 230F and 230G shown in FIGS. 7C, 7D and 7E, respectively, syndrome bits from memory MS4, MS5 and MS6 are applied to exclusive-NOR gates 115, 130 and 147, respectively, all at the second level of re-encoding. The final comparisons are made in exclusive-NOR gates 121, 136 and 150, respectively, whose outputs are inverted through inverters 122, 137 and 151, respectively, to provide outputs CS4, CS5 and CS6.

Those skilled in the art are aware that the particular logic circuitry set out herein may be altered without departing from the basic idea. For example, a positive logic could be employed where exclusive-OR circuits would substitute for exclusive-NOR circuits. Also, it is clear that the invention is not limited to the code set out in the table. Therefore, the invention is limited only by the scope of the appended claims.

The invention claimed is:

1. An error correction code (ECC) system for a computer system including an ECC syndrome encoder for generating an initial M-bit syndrome from each N-bit digital word for use in the computer, said ECC system comprising:

receiving circuitry for receiving each N-bit digital word and its associated initial ECC M-bit syndrome; and M syndrome bit generators each coupled to said receiving circuitry for combining a unique pattern of less than N bits from the N-bit digital words from the receiving circuitry with a unique pattern of less than M bits from the initial M-bit syndromes, with each of the N bits providing an input to a plurality of less than M syndrome bit generators, each generator providing a corresponding error bit of an error code.

2. An error correction code (ECC) system for a computer system, the computer system having an ECC syndrome encoder for generating an initial ECC syndrome from each digital value provided to the ECC syndrome encoder, said ECC system comprising:

memory for storing each digital value and the digital value's associated initial ECC syndrome; and logic coupled to said memory for combining each bit of said associated initial ECC syndrome with a unique subset of bits of said digital value for generating an error code indicative of an error in said digital value.

3. An error correction code (ECC) system for a computer system, comprising:

a syndrome encoder receiving a digital value for generating a corresponding initial ECC syndrome;

memory coupled to said syndrome encoder for storing said digital value and said corresponding initial ECC syndrome; and logic coupled to said memory for combining each bit of said corresponding initial ECC syndrome with a unique subset of bits of said digital value for generating an error code indicative of an error in said digital value.

4. The ECC system of claim 3, wherein said logic comprises:

a plurality of syndrome bit generators, each one of said plurality of syndrome bit generator for combining one bit of said corresponding initial ECC syndrome with a corresponding unique subset of bits of said digital value for generating a corresponding bit of said error code.

\* \* \* \* \*